(12) United States Patent
Le et al.

(10) Patent No.: US 6,690,602 B1
(45) Date of Patent: Feb. 10, 2004

(54) ALGORITHM DYNAMIC REFERENCE PROGRAMMING

(75) Inventors: Binh Quang Le, San Jose, CA (US); Pau-ling Chen, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/119,391

(22) Filed: Apr. 8, 2002

(51) Int. Cl.⁷ .............................................. G11C 11/34
(52) U.S. Cl. ................... 365/185.33; 365/185.2
(58) Field of Search ......................... 365/185.33, 185.2

(56) References Cited

U.S. PATENT DOCUMENTS

| | | | |
|---|---|---|---|
| 5,163,021 A | 11/1992 | Mehrotra et al. | 365/185.03 |
| 5,754,475 A | 5/1998 | Bill et al. | 365/185.25 |
| 6,108,259 A * | 8/2000 | Choi et al. | 365/210 |
| 6,538,922 B1 | 3/2003 | Khalid et al. | 365/185.2 |

FOREIGN PATENT DOCUMENTS

EP  1271550 A2  1/2003

OTHER PUBLICATIONS

International Search Report dated Sep. 5, 2003, for International Application Ser. No. PCT/US03/04611.

* cited by examiner

*Primary Examiner*—M. Tran
(74) *Attorney, Agent, or Firm*—Amin & Turocy, LLP

(57) ABSTRACT

A method of cycling dual bit flash memory arrays having a plurality of dual bit flash memory cells arranged in a plurality of sectors with each sector having an associated reference array that have dual bit flash memory cells that are cycled with the plurality of dual bit flash memory cells in the sectors. The dual bit flash memory cells in the associated reference array are then programmed.

17 Claims, 3 Drawing Sheets

ALGORITHM DYNAMIC REFERENCE PROGRAMMING

TECHNICAL FIELD

This invention relates generally to memory systems and in particular to systems having and memory array and associated reference arrays. Even more particularly, this invention relates to a method of erasing dual bit flash memory cells and associated reference arrays and a method of maintaining the functionality of the reference arrays.

BACKGROUND ART

Flash memory is a type of electronic memory media that can be rewritten and that can hold its content without the consumption of power. Flash memory devices generally have life spans from 100K to 300K write cycles. Unlike dynamic random access memory (DRAM) devices and static random memory (SRAM) devices in which a single byte can be erased, flash memory devices are typically erased and written in fixed multi-bit blocks or sectors. Flash memory technology evolved from electrically erasable read only memory (EEPROM) chip technology, which can be erased in situ. Flash memory devices are less expensive and denser, meaning that flash memory devices can hold more data per unit area. This new category of EEPROMs has emerged as an important non-volatile memory that combines the advantages of erasable programmable read only memory (EPROM) density with EEPROM electrical erasability.

Conventional flash memory devices are constructed in a cell structure wherein a single bit of information is stored in each cell. In such single bit memory architectures, each cell typically includes a metal oxide semiconductor (MOS) transistor structure having a source, a drain, and a channel in a substrate or P-well, as well as having a stacked gate structure overlying the channel. The stacked gate may further include a thin gate dielectric layer (sometimes referred to as a layer of tunnel oxide) formed on the surface of the substrate or P-well. The stacked gate also includes a polysilicon floating gate overlying the tunnel oxide and an interpoly dielectric layer overlying the floating gate. The interpoly dielectric is often a multilayer insulator such as an oxide-nitride-oxide (ONO) layer having two oxide layers sandwiching a nitride layer. Lastly, a polysilicon control gate overlies the interpoly dielectric layer.

The control gate is connected to a wordline associated with a row of such cells to form sectors of such cell in a typical NOR configuration. In addition, the drain regions of the cells are connected together by a conductive bitline. The channel of the cell formed between the source and drain regions conducts current between the source and drain in accordance with an electric field formed in the channel by a voltage applied to the stacked gate structure by a wordline attached to the stacked gate structure. In the NOR configuration, each drain terminal of the transistors within a column is connected to the same bitline. In addition, the stacked gate structure of each flash cell in a row is connected to the same wordline. Typically, the source terminal of each cell is connected to a common source terminal. In operation, individual flash cells are addressed via the respective bitline and wordline using peripheral decoder and control circuitry for programming (writing), reading and erasing the cell.

The single bit stacked gate flash memory cell is programmed by applying a programming voltage to the control gate, connecting the source to ground and connecting the drain to a programming voltage. The resulting high electric field across the tunnel oxide results in a phenomenon called "Fowler-Nordheim" tunneling. During Fowler-Nordheim tunneling, electrons in the channel region tunnel through the gate oxide into the floating gate and become trapped in the floating gate since the floating gate is surrounded by interpoly dielectric and the tunnel oxide. As a result of the trapped electrons, the threshold voltage of the cell increases. This change in the threshold voltage (and thereby the channel conductance) of the cell created by the trapped electrons causes the cell to be programmed.

In order to erase a typical single bit stacked gate flash memory cell, a voltage is applied to the source, the control gate is held at a negative potential, and the drain is allowed to float. Under these conditions, an electric field is developed across the tunnel oxide between the floating gate and the source. The electrons that are trapped in the floating gate flow toward and cluster at the portion of the floating gate overlying the source region. The electrons are then extracted from the floating gate and into the source region by way of Fowler-Nordheim tunneling through the tunnel oxide. The cell is erased as the electrons are removed from the floating gate.

In conventional single bit flash memory devices, erase verification is performed to determine whether each cell in a block or set of cells has been properly erased. Current single bit erase verification methodologies provide for verification of bit or cell erasure, and application of supplemental erase pulses to individual cells that fail the initial verification. Thereafter, the erased status of the cell is again verified and the process continues until the cell or bit is successfully erased or the cell is marked as unusable.

Recently, dual bit flash memory cells have been introduced that allow the storage of two bits of information in a single memory cell. The conventional programming and erase verification methods employed with single bit stacked gate architectures are not adequate for such dual bit devices. The dual bit flash memory structures do not utilize a floating gate, such as the ONO flash memory device that employs a polysilicon layer over the ONO layer for providing wordline connections. Techniques that have been developed with conventional single bit flash memory devices do not work well for the new dual bit flash memory cells.

The dual bit flash memory cell uses what is known as a virtual ground architecture in which the source of one bit serves as the drain of adjacent bits. During read operations the junction nearest the bit being read is the ground terminal and the other side of the cell is the drain terminal. This is called reverse read. The drain is switched during programming and erase back to the nearest junction using Vdrain voltage instead of ground, which is used for read and verify operations.

Another problem that has emerged is the charge loss after cycling of the cell. The inventors have determined that the major challenge for dual bit operation comes from the combination of the charge loss and complimentary bit disturb under the two conditions: 1. CBD (complimentary bit disturb) at BOL (beginning of life); and 2. Charge loss post cycling at EOL (end of life or post bake). Test data indicates that the CBD is higher near the BOL and the distributions overlay the program Vt after cycling and bake (EOL). The overlap of the two distributions prevents normal read sensing schemes from working correctly for double operations. In other words, it cannot be determined where the data in a CB or NB is a one or a zero because as the distributions approach each other, it cannot be reliably determined if the data is a one or a zero. This is because the data read from the cell is compared to static references. Another problem is that the charge loss (post cycling) for a programmed cell and a CBD are not in a 1 to 1 relationship. The post cycled CBD cell loses only about 60% of the total Vt that its program cell loses. Therefore, after cycling and bake normal sensing method to read CBD and zeros cannot be used.

As a result of the poor CBD to zero window after cycling and bake, alternative methods of read were developed and explored. Of the many alternative methods of read, a method was developed called the "Average Dynamic Reference Method" and was determined to be the best method and solved many of the problems associated with dual bit operation. The average dynamic reference method extended the usable life of the dual bit memory cell to the designed life. The average dynamic reference method uses two reference cells "averaged" and reads each bit only once to determine the data for each cell. The reference cells are erased at the same time the array is erased so that reference cells are the same "age" as the array cells because they have endured the same number of cycles as the data cells in the sector array. However, when the cells in a sector and the associated reference arrays are erased, it is then impossible to accurately read the cells in the reference array because the cells in the reference array have also been erased.

Therefore, what is needed is a method of recycling the sector array and reference array so that the reference array is available to read the sector array immediately after the sector is erased and before any programming of the sector array is done.

SUMMARY OF THE INVENTION

According to the present invention, the foregoing and other objects and advantages are achieved by a dual bit flash memory device having a plurality of sector arrays and a reference array associated with each sector array and which contain a plurality of dual bit flash memory cells.

In accordance with a first aspect of the invention, the dual bit flash memory cells in the associated reference arrays are cycled with the dual bit flash memory cells in the sector array so that all the cells in the sector arrays and associated reference arrays are the same "age."

In accordance with a second aspect of the invention, the dual bit flash memory cells in the associated reference arrays are immediately programmed after being erased so that the reference arrays are ready to function as accurate references.

The described invention thus provides a dual bit flash memory array that allows dual bit operation of the flash memory device by allowing the use of dual dynamic references that are cycled with the dual bit memory cells in the flash memory and provides dual dynamic reference arrays that are immediately ready for use as references after a sector is erased.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

MODE(S) FOR CARRYING OUT THE INVENTION

Reference is now made in detail to a specific embodiment or specific embodiments of the present invention that illustrate the best mode or modes presently contemplated by the inventors for practicing the invention.

Figure 1:
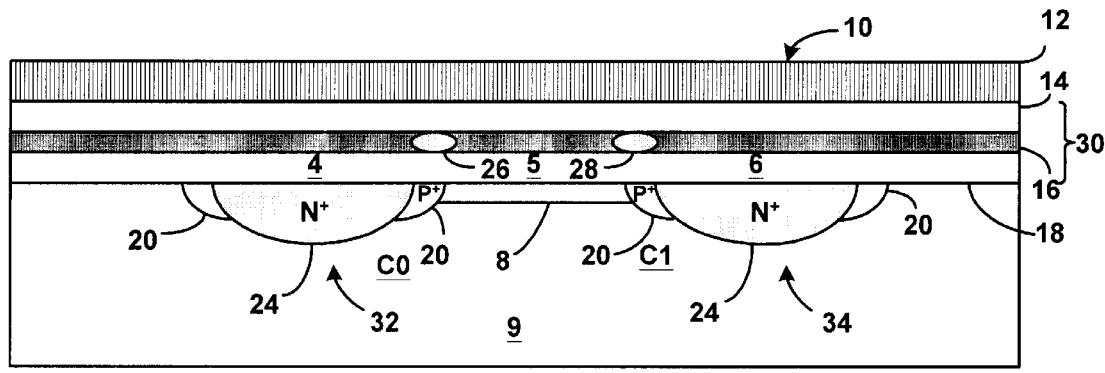
FIG. 1 is a side cross-sectional view of an exemplary dual bit memory cell with which various aspects of the present invention may be implemented.

Referring now to the drawings, FIG. 1 illustrates an exemplary dual bit memory cell 10 in which one or more of the various aspects of the invention may be carried out. The memory cell comprises a silicon nitride layer 16 sandwiched between a top silicon dioxide layer 14 and a bottom silicon dioxide layer 18 forming an ONO layer 30. A polysilicon layer 12 resides over the ONO layer 30 and provides a wordline connection to the memory cell 10. A first bitline 32 runs underneath the ONO layer 30 under a first region 4 and a second bitline 34 runs underneath the ONO layer 30 under a second region 6. The bitlines 32 and 34 are formed of a conductive portion 24 and an optional oxide portion 22. Boron core implants 20 are provided on both ends of each bitline 32 and 34 where the bitlines meet the bottom silicon dioxide layer 18 or along the entire transistor. The boron core implants are more heavily doped than the P-type substrate 9 and assist in control of the VT of the memory cell 10. The cell 10 resides on a P-type substrate 9 with the conductive portion 24 of the bitlines 32 and 34 formed from an N+arsenic implant, such that a channel 8 is formed across the P-type substrate 9. The memory cell 10 is a single transistor having interchangeable source and drain components formed from the N+arsenic implant portions 24 residing on the P-type substrate region 9 with a gate formed as part of a polysilicon wordline 12.

The silicon nitride layer 16 forms a charge trapping layer. Programming a cell is accomplished by applying appropriate voltages to the bitline acting as the drain terminal, to the gate and grounding the source bitline acting as the source terminal. The voltages generate electrical fields along the channel causing electrons to accelerate and jump from the substrate layer 9 into the layer 16 of nitride, which is known as hot electron injection. Since the electrons gain the most energy at the drain, these electrons become trapped and remain stored in the layer 16 of nitride near the drain. The cell 10 is generally uniform and the drain and source are interchangeable. Since the layer 16 silicon nitride is nonconducting, a first charge 26 can be injected into the nitride 16 near a first end of the central region 5 and a second charge 28 can be injected into the layer 16 of silicon nitride near a second end of the central region 5. Therefore, if the charge does not move there can be two bits per cell instead of one bit per cell.

As previously stated, the first charge 26 can be stored in the layer 16 of silicon nitride at a first end of the central region 5 and the second charge 28 can be stored at the other end of the central region 5 such that two bits can reside per memory cell 10. The dual bit memory cell 10 is symmetrical allowing the drain and the source to be interchangeable. Thus, the first bitline 32 may serve as the drain terminal and the second bitline 34 as the source terminal when programming the left bit C0. Likewise, the second bitline 34 may serve as the drain terminal and the first bitline 32 30 as the source terminal for programming the right bit C1.

Figure 2:
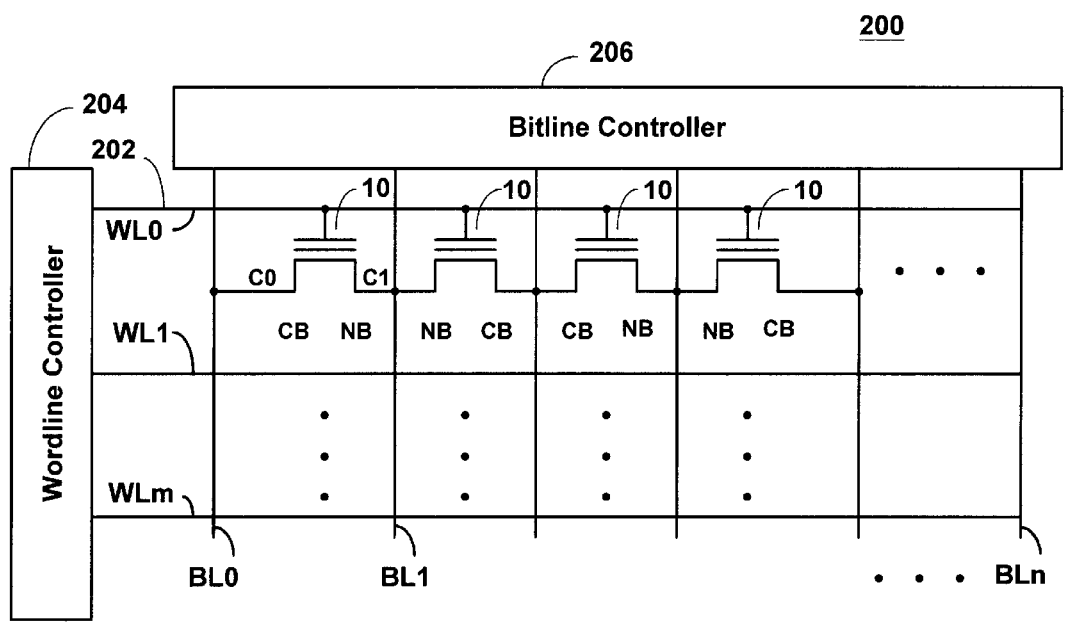
FIG. 2 is a schematic showing the interconnections of a portion of an array.

FIG. 2 and Table 1 illustrates one particular set of voltage parameters for performing reading, programming and one and two sided erases of the dual bit memory cell 10 having the first bit C0 (complimentary bit) and the second bit C1 (normal bit).

TABLE 1

| Operation | Cell | Gate | Bitline 0 | Bitline 1 | Comment |
|---|---|---|---|---|---|
| read | C0 | 4.7 v | 0 v | 1.2–2 v | complimentary bit |
| read | C1 | 4.7 v | 1.2–2 v | 0 v | normal bit |
| program | C0 | Vpp | 5–6 v | 0 v | hot electron |
| program | C1 | Vpp | 0 v | 5–6 v | hot electron |
| one side-erase | C0 | –6 v | 6 v | 0 V | hot hole injection |
| two side-erase | All cells | –6 | 6 V | 6 v | hot hole injection |

Figure 3:
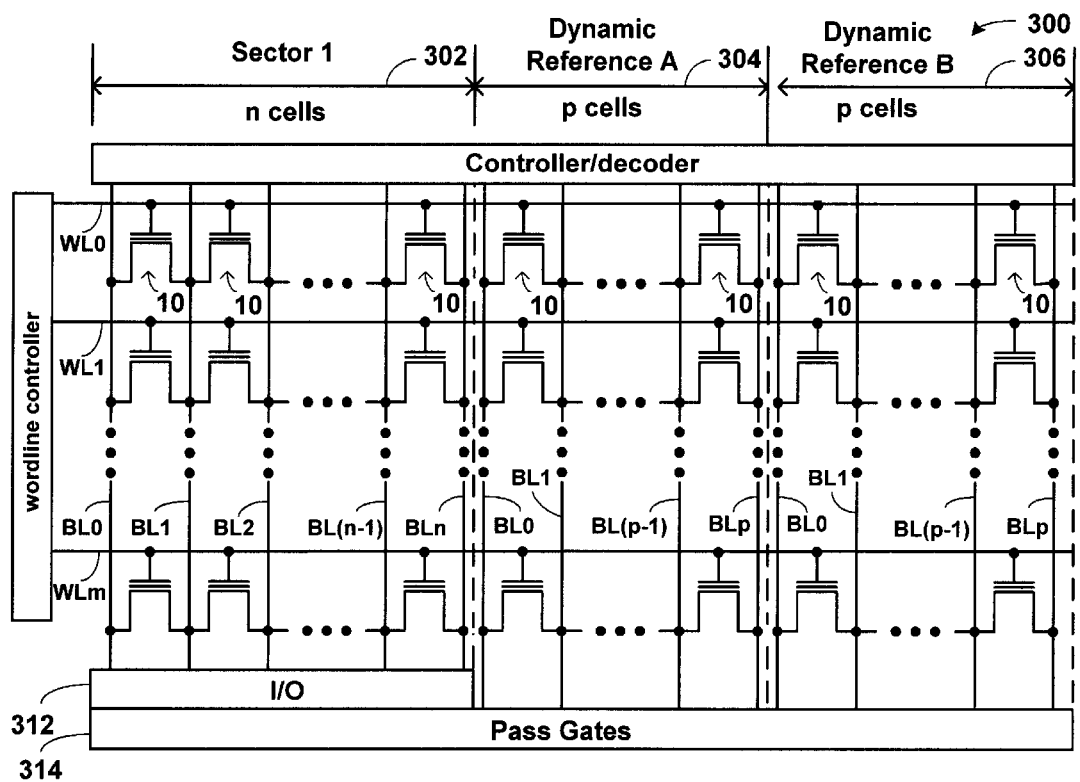
FIG. 3 is a schematic showing the interconnections of a portion of the sector array and a portion of the associated reference arrays.

FIG. 3 is a schematic showing the interconnections of a portion 300 of a first sector 302 dynamic reference A 304, and dynamic reference B 306 wherein dynamic reference A 304 and dynamic reference B 306 make up the reference array. Sector 1 302 is shown having n cells. It should be appreciated that the sectors in a memory array can have other numbers of cells. Dynamic reference A 304 and dynamic reference B 306 are shown having p cells each. Sector 302, dynamic reference A 304, and dynamic reference B 306 have dual bit cells, such as cells 10 (only a few of which are shown) in an array with common wordlines, such as WL0, WL1 and WLm connected to the dual bit cells 10 in a row and with common bitlines BL0–BLn in sector 1 302, BL0–BLp in dynamic reference A 304 and BL0–BLp in dynamic reference B 306. Note that the wordlines are common to both the dual bit cells in the sectors as well as the reference array. A Controller/Decoder 308 controls the voltages to the individual bitlines and a wordline controller 310 controls the voltages to the individual wordlines. The bitlines in Sector 1 terminate in an I/O 312. Data from the I/O 312 and from the dynamic references A and B, 304 & 06 are controlled by a series of pass gates 314.

Figure 4:
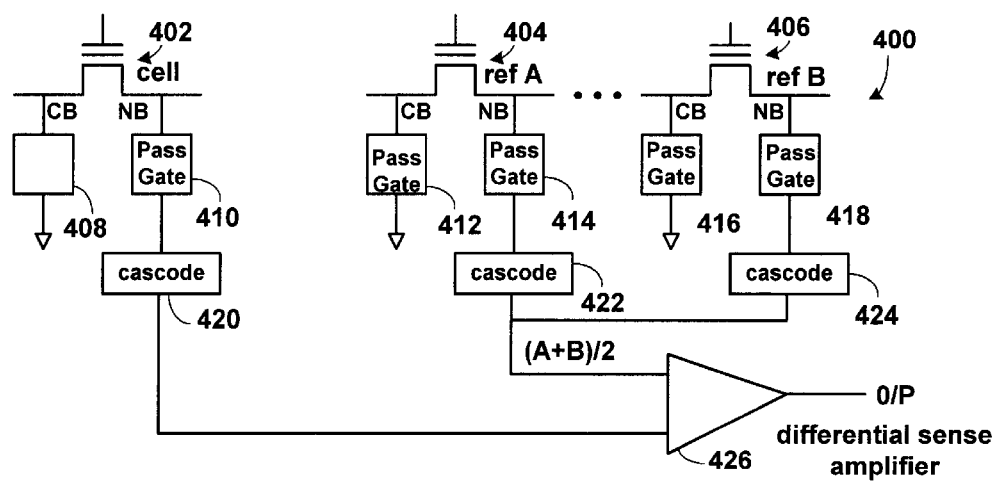
FIG. 4 is a schematic showing a comparison circuit that can be used to compare the value read from a core cell to the averaged data read from the reference array.

FIG. 4 is a schematic showing a comparison circuit 400 showing a core cell 402, a cell 404 from dynamic reference A, and a cell 406 from dynamic reference B. The core cell 402 has a CB (complimentary bit side) and an NB (normal bit side). The cells 404 and 406 also have a CB side and an NB side. There are pass gates 408–418 connected to the CB and NB sides of the cells 402, 404 & 406. In the example shown in FIG. 4, the data from the NB side of cell 402 is being compared to averaged data from the dynamic reference cells 404 & 406. The outputs of pass gates 410, 414 & 416 are input into cascode amplifiers 420, 422 & 424, respectively. The output of cascode amplifier 420 is input into differential sense amplifier 426 and the output of cascode amplifiers 422 & 424 is input into the differential sense amplifier 426, which then outputs o/p the correct value of the core cell.

Figure 5:
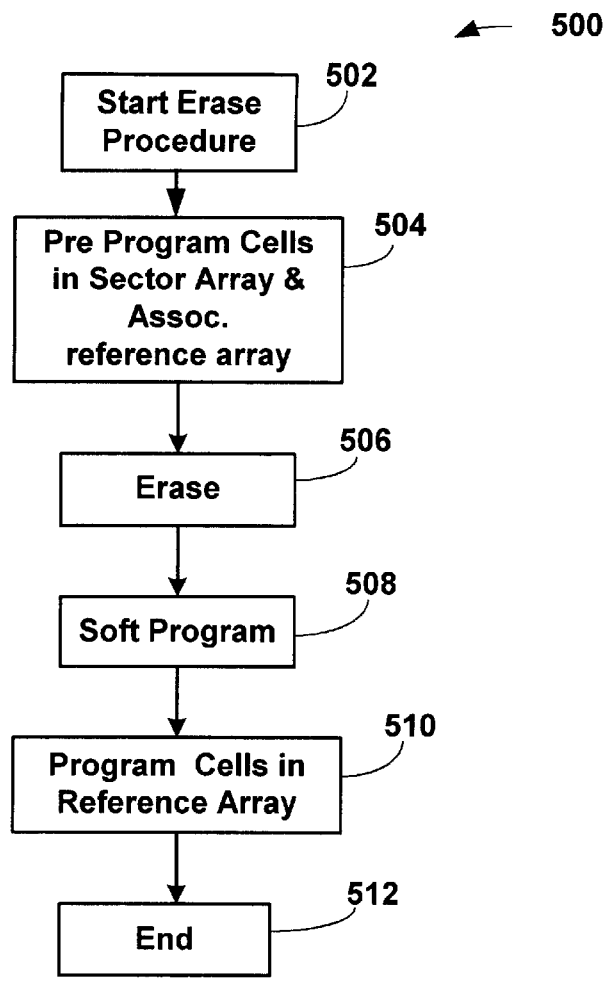
FIG. 5 is a flow diagram showing the steps to recycle the memory cells in the sector array and associated reference array.

FIG. 5 is a flow diagram 500 showing the steps to erase the memory cells in the sector array and associated reference array. The erase procedure starts at 502. The erase procedure pre-programs cells in the sector and associated reference array as indicated at 504. The cells are then subjected to an erase routine at 506. A soft program step repairs any cells that have been overerased during the erase step at 506. In accordance with the present invention, appropriate cells in the reference arrays are programmed at 510. The erase procedure is ended at 512 with the cells in the sector array erased and ready to be programmed and the cells in the reference array properly programmed and ready to be used as references. And now if the customer reads the newly erased sector, the customer will get the correct values of "1" that indicates erased bits.

Figure 6:
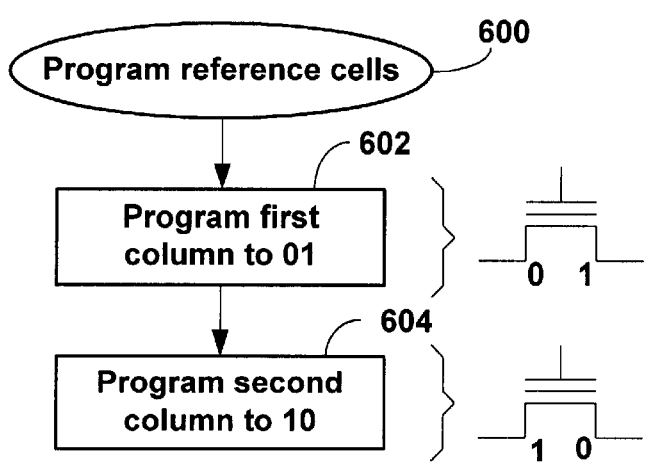
FIG. 6 is a flow diagram showing the programming of the reference cells.

FIG. 6 is a flow diagram 600 showing the programming of the reference cells. The reference cells are arranged in two reference arrays. Cells in one reference array are programmed to 10. The cells in the other reference array are programmed to 01. One column is programmed as shown in FIG. 6, step 602 and the other column is programmed as shown in FIG. 6, step 604.

In summary, the described invention provides a dual bit flash memory array that allows dual bit operation of the flash memory device by allowing the use of dual dynamic references that are cycled with the dual bit memory cells in the flash memory and provides dual dynamic reference arrays that are immediately ready for use as references after a sector is erased.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of cycling dual bit flash memory cells in a dual bit flash memory array wherein the dual bit flash memory array includes a plurality of sector arrays and a reference array associated with each sector array the method comprising:

(a) erasing dual bit flash memory cells in a sector array and dual bit flash memory cells in the associated reference array; and (b) programming the dual bit flash memory cells in the associated reference array.

2. The method of claim 1 wherein the sector array is organized in m rows and n columns and the reference array is organized in m rows mid p columns are further organized in pairs of reference cells with one of the pairs programmed 01 and the other one of the pairs programmed 10.

3. The method of claim 2 wherein step (a) includes (c) preprogramming the dual bit flash memory cells in the sector array and the associated reference array.

4. The method of claim 3 further comprising (d) soft programming the dual bit flash memory cells in the sector array and the associated reference that have been overerased in step (a).

5. The method in claim 4 further comprising (e) erasing the dual bit flash memory cells in the reference array using an erase routine.

6. The method in claim 5 further comprising (f) programming the reference arrays immediately after erasing.

7. The method in claim 6 further comprising (g) programming two separate reference arrays concurrently.

8. The method in claim 7 further comprising (h) summing and averaging the two reference arrays to use as reference values to the associated sector array.

9. A system that cycles dual bit flash memory cells in a dual bit flash memory array, wherein the dual bit flash memory array includes at cast one sector array and a reference array associated with each sector array, comprising:
   (a) a component that erases dual bit flash memory cells in a sector array and dual bit flash memory cells in the associated reference array; and
   (b) a component that programs the dual bit flash memory cells in the associated reference array.

10. The system of claim 9 wherein the sector array is organized in m rows and n columns and the reference array is organized in m rows and p columns are further organized in pairs of reference cells with one of the pairs programmed 01 and the other one of the pairs programmed 10.

11. The system of claim 9, wherein step (a) includes (c) a component that programs the dual bit flash memory cells in the sector array and associated reference array.

12. The system of claim 9, further comprising (d) a component that soft programs the dual bit flash memory cells in the sector array and associated reference that have been overerased in step (a).

13. The system in claim 9, further comprising (e) a component that erases the dual bit flash memory cells in the reference array using an erase routine.

14. The system in claim 9, further comprising (f) a component that programs the reference arrays immediately after erasing.

15. The system in claim 9, further comprising (g) a component that programs two separate reference arrays concurrently.

16. The system in claim 9, further comprising (h) a component that sums and averages said two arrays to use as reference values to the associated sector array.

17. A method of cycling dual bit flash memory cells in a dual bit flash memory array, wherein the dual bit flash memory array includes a plurality of sector arrays and a reference array associated with each sector array the method comprising:
   means for erasing dual bit flash memory cells in a sector array and dual bit flash memory cells in the associated reference array; and
   means for programming the dual bit flash memory cells in the associated reference array.

* * * * *

UNITED STATES PATENT AND TRADEMARK OFFICE
CERTIFICATE OF CORRECTION

PATENT NO. : 6,690,602 B1
DATED : February 10, 2004
INVENTOR(S) : Binh Quang Le et al.

It is certified that error appears in the above-identified patent and that said Letters Patent is hereby corrected as shown below:

<u>Column 6,</u>
Line 65, "mid P" should be -- and P --

Signed and Sealed this

Fifteenth Day of June, 2004

JON W. DUDAS
*Acting Director of the United States Patent and Trademark Office*